United States Patent [19]

Isohata

[11] Patent Number: 5,359,389
[45] Date of Patent: Oct. 25, 1994

[54] EXPOSURE APPARATUS INCLUDING TWO ILLUMINATING SYSTEMS AND EXPOSURE PROCESS USING THE SAME

[75] Inventor: Junji Isohata, Tokyo, Japan

[73] Assignee: Canon Kabushiki Kaisha, Tokyo, Japan

[21] Appl. No.: 134,857

[22] Filed: Oct. 13, 1993

Related U.S. Application Data

[63] Continuation of Ser. No. 846,065, Mar. 5, 1992, abandoned.

[30] Foreign Application Priority Data

Mar. 13, 1991 [JP] Japan ............................ 3-048101

[51] Int. Cl.$^5$ .......................................... G03B 27/42
[52] U.S. Cl. ........................................ 355/53; 355/1;
355/46; 355/70
[58] Field of Search ............... 356/401; 355/43, 53, 355/1, 70, 46, 218

[56] References Cited

U.S. PATENT DOCUMENTS

| | | | |
|---|---|---|---|
| 3,494,695 | 2/1970 | Sollima et al. | 355/41 |
| 3,687,538 | 8/1972 | Matsumoto | 355/218 |
| 3,784,301 | 1/1974 | Sato | 355/218 |
| 3,799,666 | 3/1974 | Fukushima et al. | 355/218 |
| 4,620,785 | 11/1986 | Suzuki et al. | 355/53 |
| 4,676,630 | 6/1987 | Matsushita et al. | 355/53 |
| 4,696,889 | 9/1987 | Yevick | 430/311 |
| 4,748,477 | 5/1988 | Isohata et al. | 355/53 |
| 4,769,680 | 9/1988 | Resor, III et al. | 355/43 |
| 4,770,972 | 9/1988 | Nelson et al. | 430/138 |
| 4,785,187 | 11/1988 | Kariya et al. | 250/491.1 |
| 4,785,192 | 11/1988 | Bruning | 250/548 |
| 4,814,830 | 3/1989 | Isohata et al. | 355/54 |
| 4,896,183 | 1/1990 | Ohashi et al. | 355/27 |
| 4,998,134 | 3/1991 | Isohata et al. | 355/53 |

*Primary Examiner*—Richard A. Wintercorn
*Attorney, Agent, or Firm*—Fitzpatrick, Cella, Harper & Scinto

[57] ABSTRACT

Disclosed are an exposure apparatus and process, including a holding unit for holding first and second objects such as a mask and a substrate, a first illumination system for illuminating the first object with an exposure light, a projection optical system for forming an image of a portion such as a pattern portion of the first object illuminated with the exposure light onto the second object and a second illumination system for illuminating a portion such as peripheral portion of the second object held by the holding unit outside of a portion of the second object illuminated with the exposure light from the first illumination system. The exposure apparatus or process may further include a moving unit or step for moving the first and second objects as a unit relative to the projection optical system and a control unit or step for causing the moving unit to move the first and second objects as a unit relative to the projection optical system while causing the first illumination system and the second illumination system to illuminate the first object and the second object, respectively, so that the image of the pattern on the first object is tranferred onto the second object through the projection optical system.

27 Claims, 3 Drawing Sheets

EXPOSURE APPARATUS INCLUDING TWO ILLUMINATING SYSTEMS AND EXPOSURE PROCESS USING THE SAME

This application is a continuation of prior application, Ser. No. 07/846,065 filed Mar. 5, 1992, now abandoned.

BACKGROUND OF THE INVENTION

1. Field of the Invention

The present invention relates to an exposure apparatus or aligner and an exposure process, and in particular, to those in which an image of a pattern formed on an original body or a mask is exposure-transferred onto an exposure body or a substrate by scan-exposing the mask and the substrate through a mirror projection optical system while moving the mask and the substrate as a unit relative to the mirror projection optical system. Further in particular, the present invention also relates to an exposure apparatus and an exposure process for producing a liquid crystal display panel, especially, a large-sized liquid crystal display panel.

2. Related Background Art

A full wafer or one-shot exposure apparatus in which an image of a pattern formed on a mask is exposure-transferred onto a substrate by scan-exposing the mask and the substrate through a mirror projection optical system while moving the mask and the substrate as a unit relative to the mirror projection optical system has been used as an exposure apparatus to be used for producing a liquid crystal display panel, in particular, a liquid crystal display panel of a size of about 10 inches which expected to be widely utilized for small scale or personal computers. This is because such a type of exposure apparatus has a good resolution and a high productivity.

In this exposure apparatus, there is provided a well-known projection system containing three mirrors which have surfaces ground to a very high precision, and the mask and the substrate are scan-exposed as a unit relative to the projection system so that an entire image of the pattern on the mask is transferred onto the substrate using a good image area of an arcuate slit shape obtained by the projection system. In this apparatus, the size of an exposure area in a scanning direction (Y direction) is determined by a distance by which the mask and the substrate are scanned relative to the projection system, while that in a direction (X direction) orthogonal to the scanning direction is determined by a width in the X direction of the arcuate slit imaged by the mirror projection system.

On the other hand, the crystal liquid display panel has been produced as follows: The pattern on the mask is transferred onto a photoresist on the substrate, and processes similar to those for producing semiconductor devices such as IC's and LSI's are performed. The substrate is used as a pixel driving circuit for controlling the drive of the liquid crystal.

In the exposure apparatus for producing liquid crystal display panels, a necessary exposure area for producing the liquid crystal display panel will theoretically suffice if this exposure area has a size that covers a pixel pattern portion of the display panel and an electrode pattern portion provided on its periphery. In a large-sized substrate, however, a substrate having a size larger than an exposure area needed to expose a portion which will become a liquid crystal display panel is generally needed since a resist coating uniformity at the substrate periphery is low.

At present, the following is about to become a standard. That is, two liquid crystal display panels having a size of about 10 inches are taken from a large substrate of 320 mm×400 mm. However, the following disadvantages have arisen when only the liquid crystal panel portion is exposed using such a large substrate.

Normally, when a substrate is exposed for producing a liquid crystal display panel, a positive resist is used. Therefore, resist layers are layered on a periphery of the substrate each time one process or layer is performed unless a light beam is applied to the periphery. When the substrate is supplied from and to a transport cassette in the exposure apparatus, the layered resist layers are brought into engagement with a slot portion of the cassette to be peeled off. Thus, the peeled resist becomes dust. Further, the resist also becomes dust when the substrate is scribed. If a pattern transfer is performed with the dust on the substrate surface (the side on which the photoresist is coated), the yield of the liquid crystal panel extremely decreases.

In order to solve this problem, a light beam needs to be applied only to the photoresist on the periphery of the liquid crystal display panel on the substrate so as not to cause the resist layer to be layered thereon. Conventionally, the fabrication of liquid crystal display panels has been conducted in the following manner. While only a liquid crystal display panel portion requiring a considerable resolution is exposed using the above-discussed mirror projection type exposure apparatus or a well-known lens projection type exposure apparatus, its periphery is exposed using a proximity exposure apparatus which does not have a resolution needed to expose the liquid crystal display panel but is capable of exposing a large image field en bloc.

In a case wherein the periphery is exposed by another exposure apparatus, however, two exposure processes have to be conducted by two kinds of exposure apparatuses, respectively, when one-process (layer) patterning is to be performed on a substrate. As a result, the productivity is greatly lowered.

On the other hand, when considering that the exposure of the periphery is also conducted by the exposure apparatus that exposes the liquid crystal panel, portion, such exposure is possible by extending a scanning distance with respect to a londitudinal or Y direction in the mirror projection exposure apparatus. With respect to a lateral or X direction, such exposure becomes possible by expanding the width of an arcuate slit determined by the mirror projection optical system.

The extension of the scanning distance by which the mask and substrate are moved as a unit can readily be achieved only by extending a scanning guide for guiding the movement of the mask and substrate. The expansion of the width of the arcuate slit in the lateral direction, however, is quite difficult, if not impossible. In the following are reasons therefore.

1. The width of the arcuate slit needs to have a length that is capable of effectively exposing a liquid crystal display panel having a desired size. For example, the width should be set to about 280 mm in the exposure apparatus for producing a panel having a size of 10 inches. When the width of the arcuate slit is extended to 320 mm which is a lateral length of the substrate, the area of the slit is enlarged and hence an illumination light or exposure light for transferring the pattern will be diffused on the substrate. As a result, the illuminance on the substrate is reduced, and an exposure time during which the liquid crystal display panel portion is exposed is prolonged, leading to a low productivity.

2. When the width of the slit is expanded, the mirror projection optical system is enlarged in size and hence its working becomes difficult. Further, the size of the exposure apparatus is made large, and a wide foot space therefor is needed. A large exposure apparatus is undesirable because the exposure apparatus for producing the liquid crystal display panel is usually installed in a clean room similar to that for producing semiconductor devices.

SUMMARY OF THE INVENTION

An object of the present invention is to provide an exposure apparatus and an exposure process in which both the pattern portion and peripheral portion of a substrate can be exposed without lowering its productivity and the size of the apparatus itself is relatively small.

According to one aspect of an exposure apparatus according to the present invention, there are provided a holding unit for holding first and second objects, a first illumination system for illuminating the first object with an exposure light, a projection optical system for forming an image of a portion of the first object illuminated with the exposure light onto the second object and a second illumination system for illuminating a portion of the second object held by the holding unit outside of a portion of the second object illuminated with the exposure light from the first illumination system.

The exposure apparatus may further include a moving unit for moving the first and second objects as a unit relative to the projection optical system and a control unit for causing the moving unit to move the first and second objects as a unit relative to the projection optical system while causing the first illumination system and the second illumination system to illuminate the first object and the second object, respectively, so that the image of the pattern on the first object is transferred onto the second object through the projection optical system.

According to one aspect of an exposure process according to the present invention, there are conducted steps of providing first and second illumination systems, holding the first and second objects by a holding unit, illuminating the first object held by the holding unit with an exposure light from the first illumination system, forming an image of a portion of the first object illuminated with tile exposure light onto the second object held by the holding unit using a projection optical means and illuminating a portion of the second object held by the holding unit outside of a portion of the second object illuminated with the exposure light from the first illumination system, without using the projection optical system.

The exposure process may further include a step of moving the first and second objects as a unit relative to the projection optical system, and the two illuminating steps and the moving step may be substantially simultaneously performed.

These advantages and others will be more readily understood in connection with the following detailed description, claims and drawings.

DETAILED DESCRIPTION OF THE PREFERRED EMBODIMENT

Figure 1:
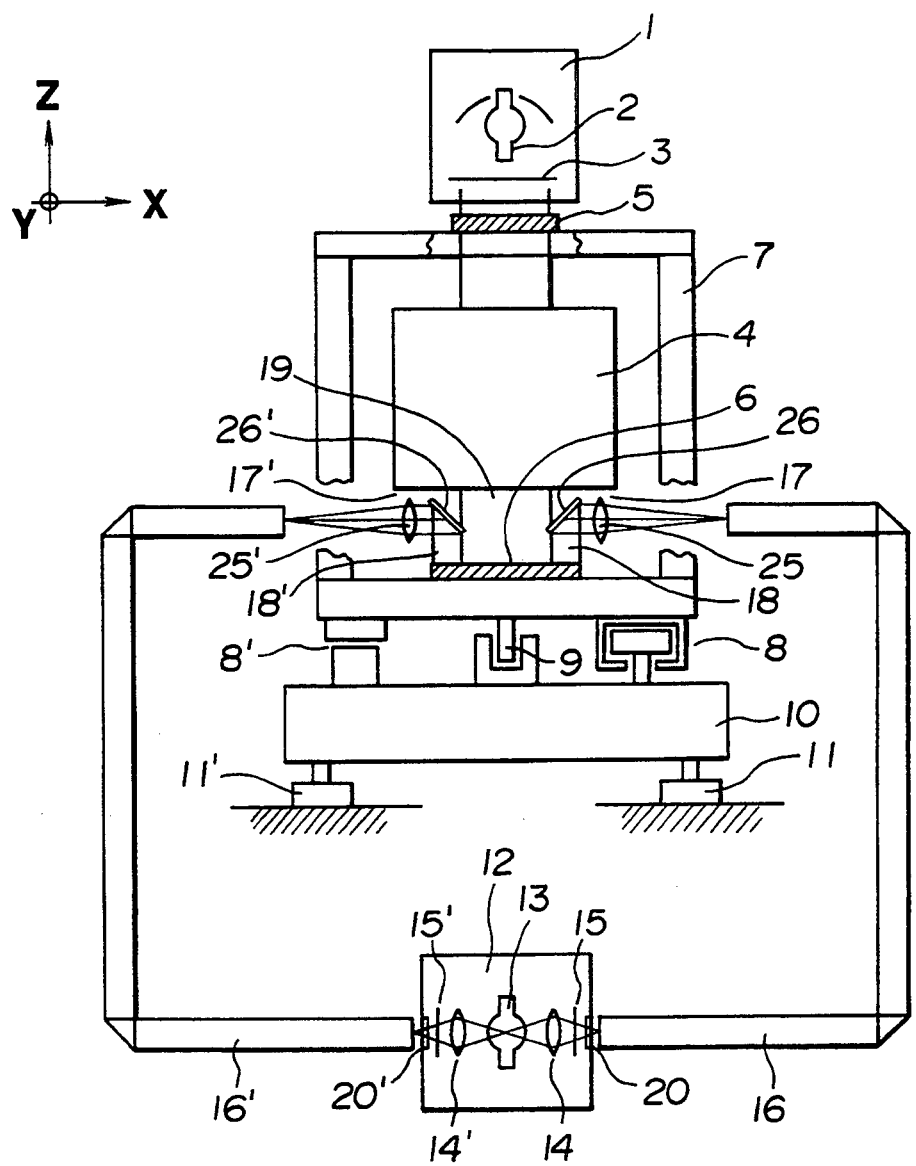
FIG. 1 is a view showing the structure of a first embodiment of an exposure apparatus according to the present invention.

FIG. 1 shows an overall structure of a first embodiment of a mirror projection exposure apparatus to which the present invention is applied. The exposure apparatus is directed to produce a liquid crystal display panel. A substrate for use as the liquid crystal display panel is processed each time a photoresist of each process or layer is exposed, similar to a fabrication process of a semiconductor device, so that a circuit including pixel electrodes for driving the liquid crystal is formed on its surface. The exposure apparatus of this embodiment is used for exposure-transferring a pattern for forming the circuit on the substrate in that process.

In FIG. 1, reference numeral 1 designates an illumination system for generating, as an illumination light or exposure light, a light beam having a wavelength to which the photoresist coated on the surface of a substrate 6 is sensitive. The exposure light 19 from the illumination system 1 is utilized for exposure-transferring a circuit forming pattern formed on a mask 5 onto a liquid crystal display panel portion 6a (see FIG. 2) on the substrate 6. The exposure light 19 from the illumination system 1 illuminates the mask 5 and the substrate 6 in an arcuate slit shape (see FIG. 2).

In FIG. 1, reference numeral 2 designates an ultrahigh pressure mercury lamp, and reference numeral 3 designats a shutter for controlling the illumination of the exposure light 19 from the illumination system 1 onto the mask 5. The shutter 3 is automatically opened and closed in accordance with an operation instruction from a control circuit (not shown), and transmission and interception of the exposure light 19 is controlled. The ultra-high pressure mercury lamp 2 and the shutter 3 are contained in the illumination system 1.

Further, in FIG. 1, reference numeral 4 designates a mirror projection optical system including a convex mirror, a concave mirror and a trapezoid mirror, reference numeral 7 designates a carriage for supporting mask 5 and substrate 6 as a unit, reference numerals 8 and 8' designate air bearing guides for movably supporting the carriage 7 in the Y direction or scanning direction and reference numeral 9 designates a linear motor for moving the carriage 7 in the Y direction relative to the projection system 4. The mirror projection optical system 4 makes an image of a portion of the mask 5 illuminated in an arcuate slit with the exposure light 19 from the illumination system 1, on the substrate 6.

The mask 5 and the substrate 6 are respectively supported by the carriage 7 substantially parallel to an XY plane, and are located at opposite sides of the projection system 4 with respect to the Z direction. The mask 5 is positioned on an object plane of the projection system 4, while the substrate 6 is positioned on an image plane of the projection system 4. The air bearing guides 8 and 8' have guide rails extending in the Y direction and sliders to which pads are fixed for spouting static pressure air toward the guide rails, respectively. Those guide rails are fixed to an upper surface of a base 10, and the sliders are settled on a bottom surface of the carriage 7. The air bearing guide 8 is a type in which displacements of the carriage 7 in X and Z directions are constrained. The air bearing guide 8' is used solely for supporting the carriage 7 on the base 10 with respect to a vertical direction or Z direction.

Therefore, when the carriage 7 is moved by the linear motor 9 in the Y direction while illuminating the mask 5 with the exposure light 19 from the illumination system 1 and an entire image of the pattern formed on the mask 5 is exposure-transferred onto the photoresist on the substrate 6 through the projection system 4, the position the carriage 7 relative to the base 10 is restricted by the guide rail of the air bearing guide 8. The linear motor 9 may be either of a moving coil type or a moving magnet type. The linear motor 9 is settled between the air bearing guides 8 and 8' with respect to the X direction. Its movable portion is fixed to the bottom surface of the carriage 7, while its stationary portion is fixed to the upper surface of the base 10.

FIG. 1, reference numerals 11 and 11' designate vibration-free pedestals for supporting the base 10 relative to a floor.

Figure 2:
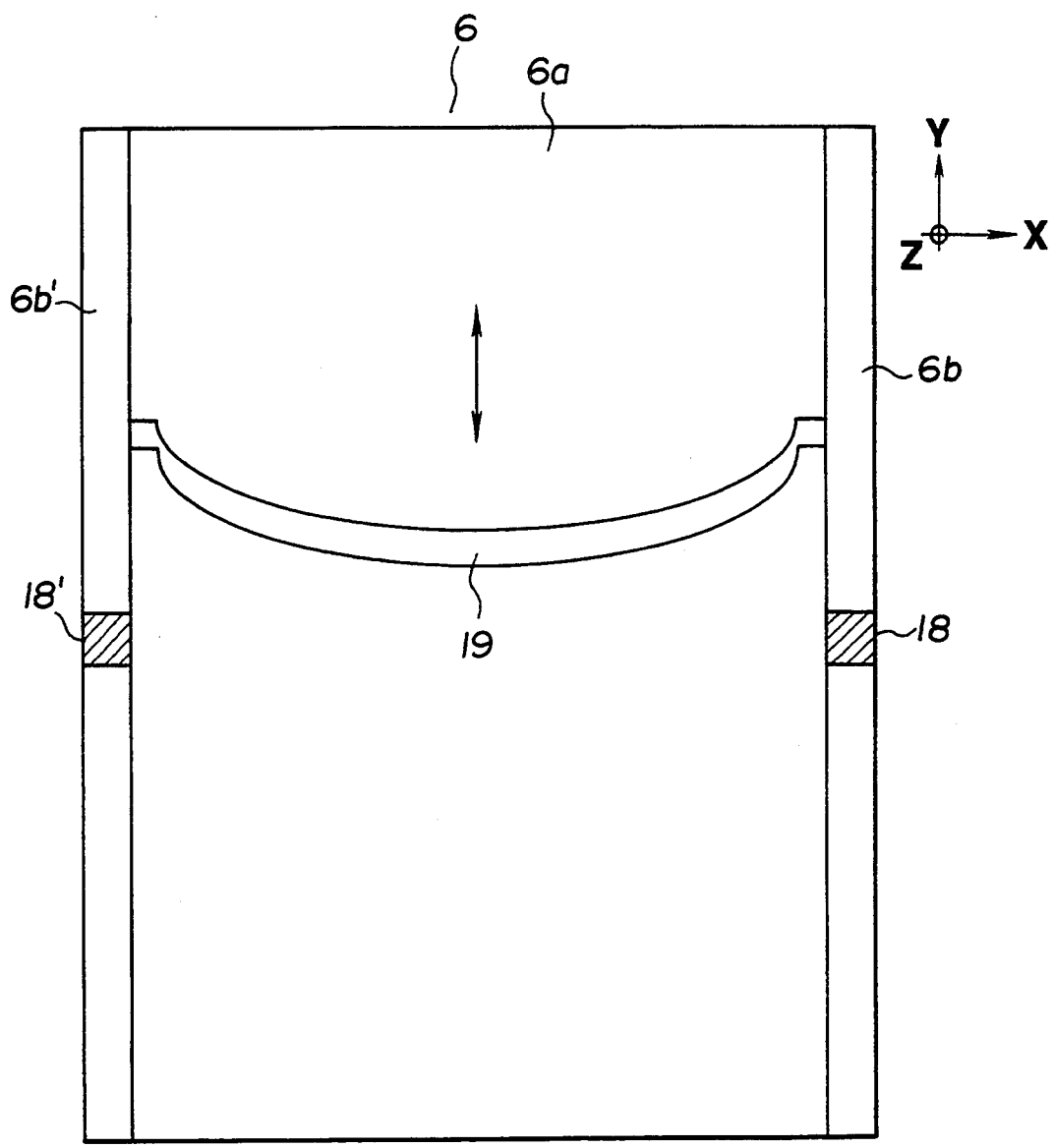
FIG. 2 is an illustration showing an exposure state of a substrate in the first embodiment.

Further, in FIG. 1, reference numeral 12 designates another illumination system for generating, as an illumination light, a light beam having a wavelength to which the photoresist coated on the surface of the substrate 6 is sensitive, similar to the illumination system 1. Illumination light beams 18 and 18' from the illumination system 12 are used for exposing peripheral portions 6b and 6b' outside of the liquid crystal display panel portion 6a on the substrate 6, as shown in FIG. 2. The peripheral portions 6b and 6b' are positioned at the opposite sides of the liquid crystal display panel portion 6a on the substrate 6 with respect to the X direction, and at the same time respectively have band shapes extending from one end of the substrate 6 to the other end thereof with respect to the Y direction (scanning direction).

An ultra-high pressure mercury tamp 13 is disposed in the illumination system 12. In the illumination system 12 of FIG. 1, reference numerals 14 and 14' designate lenses for respectively condensing the light beams generated by the ultra-high mercury lamp 13 into different positions, and reference numerals 15 and 15' designate shutters for respectively controlling transmission and interception of light beams condensed by the lenses 14 and 14' toward ND filters 20 and 20'. The shutters 15 and 15' are automatically opened and closed in response to an operation instruction from the control circuit (not shown) mentioned above. Further, the shutters 15 and 15' respectively have different drivers therefor so that their opening and closing are controlled independently from each other.

The ND filters 20 and 20' respectively comprise a plurality of portions having different densities or a portion whose density varies continuously in order to desirably adjust the amounts or intensities of lights transmitted therethrough. Positions of the filters 20 and 20' are adjuted by respective drivers (not shown) for the light beams transmitted through the shutters 15 and 15', so that the amounts of the transmitted light beams therethrough can be adjusted.

In FIG. 1, reference numerals 16 and 16' designate transmission optical systems for transmitting the light beams passed through the ND filters 20 and 20' to the illumination systems 17 and 17', respectively, and the optical systems 16 and 16' are respectively made of a fiber or a light pipe. The illumination systems 17 and 17' are interposed between the projection system 4 and the substrate 6 with respect to the Z direction, while they are respectively disposed at opposite sides of the slit-shaped exposure light 19 from the projection system 4 with respect to the X direction. The illumination systems 17 and 17' respectively have condenser lenses 25 and 25' for condensing the light beams from the transmission optical systems 16 and 16' as illuminating light beams 18 and 18' for the substrate peripheries and mirrors 25 and 25' for directing the illuminating light beams 18 and 18' toward the peripheral portions 6b and 6b' of the substrate 6.

The illuminating light beams 18 and 18' from the illumination optical systems 17 and 1 7' are irradiated in a light spot shape on the peripheral portions 6b and 6b', and are applied onto both sides of the exposure light 19 of an arcuate slit shape imaged by the projection system 4, while being a little shifted from the exposure light 19, as shown in FIG. 2. Positions and inclinations of the condenser lenses 25 and 25' or the mirrors 26 and 26' in the illumination optical systems 17 and 17' are adjusted so that the light spots of the illuminating light beams 18 and 18' are irradiated onto the peripheral portions 6b and 6b' of the substrate 6 that are not exposed by the exposure light 19.

The illuminance of the illuminating light beams 18 and 18' on the substrate 6 is adjusted using the ND filters 20 and 20' of the illumination system 12 so that this illuminance has a sufficient magnitude to which the photoresist coated on the substrate 6 is sensitive. When the image of the pattern on the mask 5 is exposure-transferred onto the substrate 6 through the projection system 4, the shutters 15 and 15' of the illumination system 12 are opened substantially at the same time with the opening of the shutter 3 in the illumination system 1. This operation is performed by the control circuit (not shown) mentioned above. The explanation of a construction of this control circuit is omitted here because this is apparent for its simple function. Thus, the illuminating light beams 18 and 18' from the illumination optical systems 17 and 17' are irradiated onto the peripheral portions 6b and 6b' while the exposure light 19 transmitted through the mirror projection optical system 4 is applied onto the display panel portion 6a of the substrate 6. Therefore, the peripheral portions 6b and 6b' are also exposed as well as the display panel portion 6a when the carriage 7 is moved by the linear motor 9 in the Y direction (scanning direction).

If the peripheral portions 5b and 6b' should not be exposed at the same time with the display panel portion 6a, the carriage 7 has only to be moved in the Y direction with the shutters 15 and 15' of the illumination system 12 closed. If only one of the peripheral portions 6b and 6b' should be exposed, only one of the shutters 15 and 15' corresponding to the peripheral portion to be exposed is opened substantially in synchronization with the opening of the shutter 3 and the carriage 7 is then moved in the Y direction.

Figure 3:
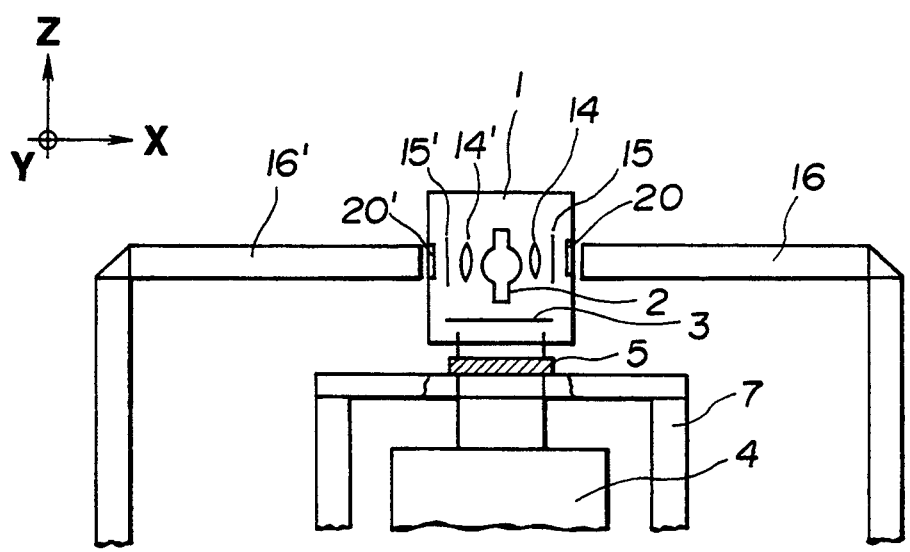
FIG. 3 is a partial view of a second embodiment of an exposure apparatus according to the present invention.

In the first embodiment, the mercury lamp 13 of the second illumination system 12 for exposing the peripheral portions 6b and 6b' is provided separately from the mercury lamp 2 of the first illumination system 1 for exposing the display panel portion 6a. It is, however, possible to obtain the illumination light for exposing the peripheral portions 6b and 6b' as well as the exposure light for exposing the display panel portion 6a from the mercury lamp 2 for the exposure light 19 without using the mercury lamp 13. In this case, lenses 14 and 14', shutters 15 and 15' and ND filters 20 and 20' are disposed for the ultra-high pressure mercury lamp 2, as shown in FIG. 3. For the rest, the illumination light beams are guided to the illumination systems 17 and 17' through the transmission optical systems 16 and 16', similar to the first embodiment.

As explained in the foregoing, according to the present invention, it is possible to expose both of two portions of the second object, for example, the pattern portion and peripheral portion of the substrate, without lowering the productivity. Further, the size of the exposure apparatus itself would not be made large. Therefore, when the present invention is applied to an exposure apparatus for producing liquid crystal display panels, the manufacturing cost of the liquid crystal display panel can greatly be reduced.

While the present invention has been described with respect to what is presently considered to be the preferred embodiments, it is understood that the invention is not limited to the disclosed embodiments. The present invention is intended to cover various modifications and equivalent arrangements included within the spirit and scope of the appended claims.

What is claimed is:

1. An exposure apparatus for transferring a pattern on a first object onto a second object, said apparatus comprising:
   holding means for holding the first and second objects;
   first illumination means for illuminating the first object held by said holding means with an exposure light;
   projection optical means for projecting an image of a portion of the first object, illuminated with the exposure light, through the first object onto the second object held by said holding means;
   second illumination means for illuminating a portion of the second object held by said holding means, outside of a portion of the second object illuminated with the exposure light from said first illumination means, wherein said first illumination means simultaneously illuminates the first object, while said second illumination means illuminates the portion of the second object, respectively; and
   moving means for moving the first and second objects relative to said projection optical means during the simultaneous illumination by said first and second illumination means.

2. An exposure apparatus according to claim 1, wherein said first illumination means illuminates the first object with a slit-shaped exposure light.

3. An exposure apparatus according to claim 1, wherein said projection optical means comprises a mirror projection optical system.

4. An exposure apparatus according to claim 1, wherein said second illumination means illuminates a peripheral portion of the second object.

5. An exposure apparatus according to claim 1, wherein said second illumination means illuminates portions of the second object, at both opposite sides of the portion of the second object illuminated with the exposure light from said first illumination means, with respective light spots, without transmission through said projection optical means.

6. An exposure apparatus according to claim 1, wherein said second illumination means comprises an optical fiber.

7. An exposure apparatus according to claim 1, wherein said second illumination means comprises a light pipe.

8. An exposure apparatus according to claim 1, wherein said second illumination means comprises changing means for changing the intensity of illuminance of the portion of the second object outside of the portion of the second object illuminated with the exposure light from said first illumination means.

9. An exposure apparatus according to claim 8, wherein said changing means comprises an ND filter.

10. An exposure apparatus according to claim 1, wherein said first illumination means comprises a first light source and said second illumination means comprises a second light source.

11. An exposure apparatus according to claim 1, wherein said first illumination means comprises a light source common to said second illumination means.

12. An exposure apparatus according to claim 11, further comprising control means for causing said moving means to move the first and second objects as a unit relative to said projection optical means while causing said first illumination means and said second illumination means to illuminate the first object and the second object, respectively, so that the image of the pattern on the first object is tranferred onto the second object through said projection optical means.

13. An exposure apparatus according to claim 12, wherein said first and second illumination means comprise shutters, respectively, and said control means controls said shutters of said first and second illumination means in synchronism with each other.

14. An exposure apparatus according to claim 12, wherein said second illumination means illuminates portions of the second object, at both opposite sides of the portion of the second object illuminated with the exposure light from said first illumination means, with respective light spots, and comprises shutters corresponding to the respective light spots, and said control means controls said shutters of said second illumination means independently from each other.

15. An exposure process for transferring a pattern on a first object onto a second object, said process comprising the steps of:
   providing first and second illumination means;
   holding the first and second objects with a holding means;
   illuminating the first object held by said holding means with an exposure light from said first illumination means;
   projecting an image of a portion of the first object, illuminated with the exposure light, through the first object onto the second object held by said holding means using a projection optical means; and
   illuminating a portion of the second object held by said holding means, outside of a portion of the second object illuminated with the exposure light from said first illumination means, wherein said step of illuminating the first object and said step of illuminating a portion of the second object are performed simultaneously, and while the first and second objects are moved relative to the projection optical means.

16. An exposure process according to claim 15, wherein said first illumination means illuminates the first object with a slit-shaped exposure light.

17. An exposure process according to claim 15, wherein the first object is a mask and the second object is a substrate.

18. An exposure process according to claim 15, wherein the first object is a mask and the second object is a substrate for fabricating a liquid crystal display panel.

19. An exposure apparatus comprising:
exposure means for exposing, through a pattern on a first object, a pattern portion on a second object with a first exposure beam by relatively scanning the first and second objects in a scanning direction with respect to the first exposure beam; and
illumination means for illuminating another portion on the second object, outside of the pattern portion, which is extended in the scanning direction, with a second exposure beam different from the first exposure beam, during the relative scanning of the first and second objects in the scanning direction.

20. An exposure apparatus according to claim 19, wherein said exposure means comprises a projection optical system for projecting the pattern on the first object illuminated with the first exposure beam onto the second object.

21. An exposure apparatus according to claim 20, wherein said illumination means illuminates the other portion on the second object with the second exposure beam, without using the first object and said projection optical system.

22. An exposure apparatus comprising:
exposure means for exposing, through a device pattern on a mask, a pattern portion on a workpiece covered by a positive resist with a first exposure beam by relatively scanning the mask and the workpiece in a scanning direction with respect to the first exposure beam; and
illumination means for illuminating another portion on the workpiece, outside of the pattern portion, which is extended in the scanning direction, with a second exposure beam different from the first exposure beam, during the relative scanning of the mask and the workpiece in the scanning direction.

23. An exposure apparatus according to claim 22, wherein said exposure means comprises a projection optical system for projecting the pattern on the first object illuminated with the first exposure beam onto the second object.

24. An exposure apparatus according to claim 23, wherein said illumination means illuminates the other portion on the workpiece with the second exposure beam, without using the mask and said projection optical system.

25. A device manufacturing method comprising the steps of:
exposing, through a device pattern on a mask, a pattern portion on a workpiece covered by a positive resist with a first exposure beam by relatively scanning the mask and the workpiece in a scanning direction with respect to the first exposure beam; and
illuminating another portion on the workpiece, outside of the pattern portion, which is extended in the scanning direction, with a second exposure beam different from the first exposure beam, during the relative scanning of the mask and the workpiece in the scanning direction.

26. A device manufacturing method according to claim 25, wherein said exposing step comprises projecting an image of the pattern on the mask illuminated with the first exposure beam onto the workpiece through a projection optical system.

27. A device manufacturing method according to claim 26, wherein said illuminating step comprises illuminating the other portion on the workpiece with the second exposure beam, without using the mask and the projection optical system.

* * * * *

UNITED STATES PATENT AND TRADEMARK OFFICE
CERTIFICATE OF CORRECTION

PATENT NO. : 5,359,389
DATED : October 25, 1994
INVENTOR(S) : Junji ISOHATA

It is certified that error appears in the above-indentified patent and that said Letters Patent is hereby corrected as shown below:

COLUMN 2:

Line 58, "therefore." should read --therefor.--.

COLUMN 5:

Line 61, "adjuted" should read --adjusted--.

COLUMN 6:

Line 16, "1 7' " should read --17'--.

COLUMN 7:

Line 20, "is" should read --are--.

COLUMN 8:

Line 22, "claim 11," should read --claim 1,--.

Signed and Sealed this

Fourth Day of April, 1995

Attest:

BRUCE LEHMAN

Attesting Officer    Commissioner of Patents and Trademarks